United States Patent
Uchiyama

[19]

[11] Patent Number: 5,919,605
[45] Date of Patent: *Jul. 6, 1999

[54] SEMICONDUCTOR SUBSTRATE EXPOSURE METHOD

[75] Inventor: Takayuki Uchiyama, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/626,238

[22] Filed: Mar. 29, 1996

[30] Foreign Application Priority Data

Mar. 30, 1995 [JP] Japan ..................................... 7-072593

[51] Int. Cl.$^6$ ........................................................ G03F 7/20
[52] U.S. Cl. ............................ 430/312; 430/394; 430/396
[58] Field of Search ..................................... 430/311, 312, 430/322, 394, 396

[56] References Cited

FOREIGN PATENT DOCUMENTS

2-62541  3/1990  Japan .
3-237459 10/1991 Japan ..................................... 430/394

*Primary Examiner*—Kathleen Duda
*Attorney, Agent, or Firm*—Hayes Soloway Hennessey Grossman & Hage PC

[57] ABSTRACT

An exposure method that enables removal of the untransferred region of a resist film without decreasing throughput of the exposure system or increasing fabrication cost of a semiconductor device. After preparing a reticle with a set of geometrically-shaped patterns, an image formation region of a resist film is exposed using the set of patterns on the reticle; thereby transferring the set of patterns to the image formation region. Then, an untransferred region of the resist film is exposed using the same set of patterns on the reticle under a different exposure condition from that in the step of transferring the set of patterns. The exposure condition is such that the set of patterns on the reticle is not transferred to the untransferred region. Preferably, the resist film is a positive resist film.

14 Claims, 9 Drawing Sheets

SEMICONDUCTOR SUBSTRATE EXPOSURE METHOD

BACKGROUND OF THE INVENTION

1. Field of the Invention

The present invention relates to a semiconductor substrate exposure method of a semiconductor substrate and more particularly, to a semiconductor substrate exposure method that is effective in an optical exposure process using a step-and-repeat manner exposure technique using ultraviolet (UV) light.

2. Description of the Prior Art

To form integrated circuit devices (ICs) on a semiconductor substrate or wafer, generally, a reduction step-and-repeat projection exposure system has been used to transfer patterns of geometrical shapes on an exposure mask or reticle to the wafer.

Specifically, a positive photoresist film is formed on the entire surface of the wafer and then, a small image field or chip site of the film is exposed to a projection of UV light at one time. After the exposure of the image field, the wafer is moved to the next image field and the process is repeated. Thus, the photoresist film is partitioned into a plurality of image fields by step-and-repeat projection of UV lights.

In this specification, the region where the patterns are transferred, in other words, where the plurality of chip sites or image fields are formed, is termed the "image formation region". On the other hand, no patterns are transferred to the periphery of the wafer. The region where no patterns are transferred is termed the "untransferred region".

Typically, the untransferred region of the photoresist film is removed from the wafer during a development process subsequent to this step-and-repeat projection process. Conventionally, this process has been performed by the following steps.

Figure 1:
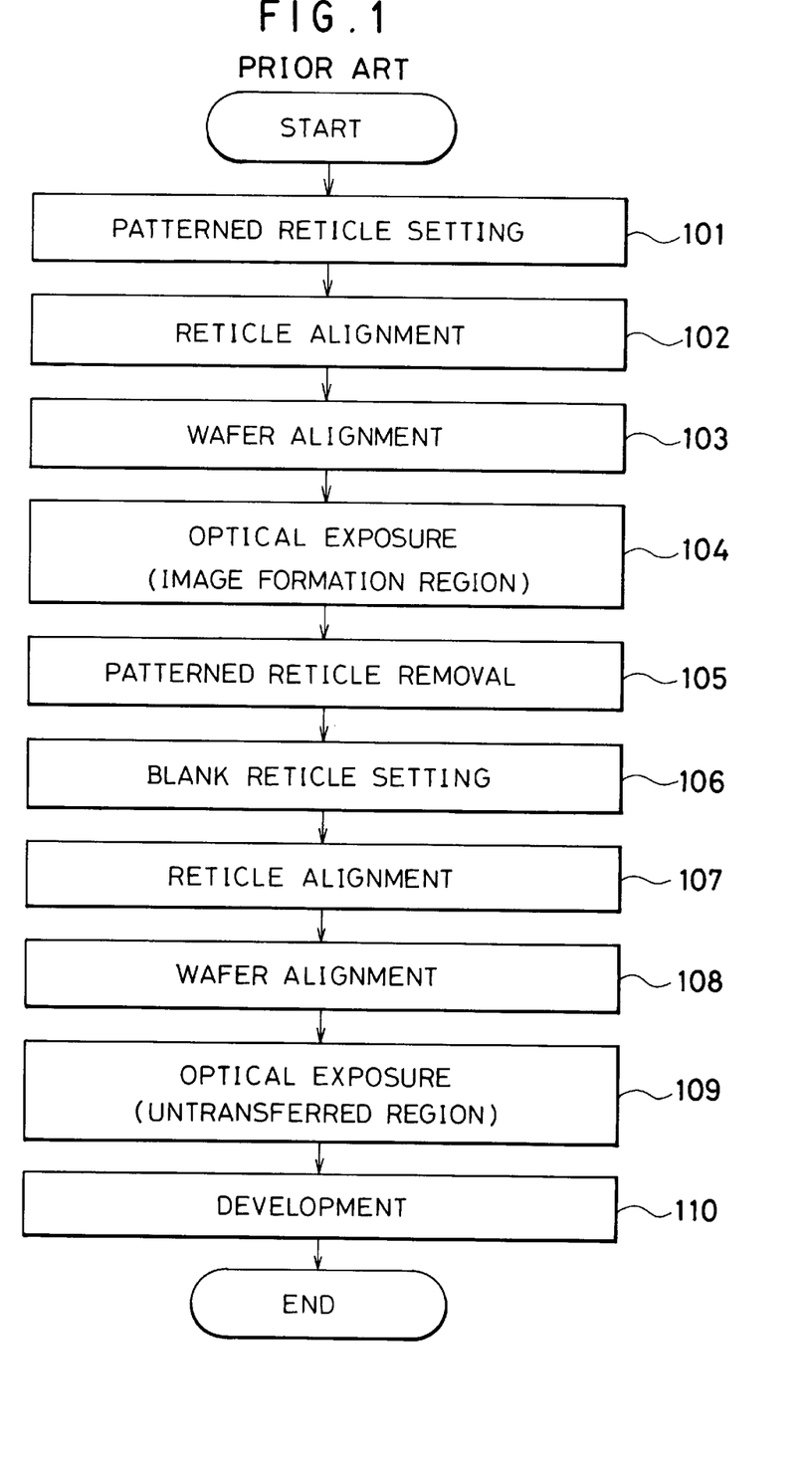
FIG. 1 is a flow chart showing a conventional exposure method of a semiconductor device using a reduction step-and-repeat projection exposure system.

As shown in FIG. 1, first, a reticle with specified patterns for at least one chip site is loaded onto a reduction step-and-repeat projection exposure system (step 101). Then, the position of the reticle is adjusted so as to be aligned with the reference position of the system (step 102). A semiconductor wafer with a positive photoresist film thereon is placed on a wafer stage of the system and is adjusted so as to be aligned with the reference position (step 103).

A plurality of optical exposure processed are performed in a step-and-repeat manner (step 104) for the respective image fields or chip sites of the photoresist film. Thus, the patterns on the reticle are transferred to the respective image fields.

The patterned reticle is removed and then, a blank reticle is loaded onto the exposure system (steps 105 and 106). The blank reticle has no pattern thereon and as a result, the exposing UV light passing through the reticle will have a uniform intensity within the entire cross section perpendicular to its optical axis.

The reticle alignment and wafer alignment processes are performed for the blank reticle (steps 107 and 108). Then, a plurality of optical exposure processed are performed in a step-and-repeat manner for the untransferred region of the photoresist film (step 109). Thus, the entire untransferred region is exposed to the UV light.

Finally, the photoresist film is developed (step 110). Through this development process, the patterns on the reticle are transferred to the respective image fields in the image formation region of the film. At the same time, the untransferred region of the film is entirely removed.

With the conventional exposure method described as above, use of the blank reticle necessitates reticle replacement time (approximately five minutes) and wafer alignment time (approximately one minute for one wafer) thereby resulting in the problem of decrease exposure system throughput.

The use of the blank reticle also causes another problem in that IC fabrication cost is increased.

To solve these problems, another conventional exposure method was developed, in which a patterned area for pattern transfer and a blank area for untransferred-area exposure are provided on the same reticle. This method was disclosed in the Japanese Non-Examined Patent Publication No 2-62541 published in Mar. 1990.

In this method, when the patterns on the reticle are transferred to the pattern formation region of the photoresist film, the step-and-repeat exposure steps are performed using the patterned area. The blank area if the reticle is used for the step-and-repeat exposure steps of the untransferred region of the film.

However, this conventional method requires that the reticle be capable of pattern formation of at least two IC chips, and therefore, this method cannot be used if the reticle is only capable of pattern formation for one chip.

Further, the necessity of the blank area decreases the number of the chips that can be exposed during each step or shot of the step-and-repeat exposure process. This also leads to reduce exposure system throughput.

Specifically, for example, when the reticle has two pattern areas for two IC chips, each exposure shot of the step-and-repeat exposure process can irradiate two image fields at a time, and therefore, the exposure shot needs to be repeated at 50 times for 100 chips. However, when the reticle has pattern and blank areas, each exposure shot irradiates only one image field, and as a result, the exposure step needs to be repeated 100 times for 100 chips.

SUMMARY OF THE INVENTION

Accordingly, an object of the present invention is to provide an exposure method that enables removal of the untransferred region of the resist film without decrease in exposure system throughput and without increase in semiconductor device fabrication cost.

The above object together with others not specifically mentioned will become clear to those skilled in the art from the following description.

An exposure method according to a first aspect of the present invention includes the step of preparing a reticle with a set of patterns of geometrical shapes; a step of exposing an image formation region of a resist film using the set of patterns of the reticle, thereby transferring the set of patterns to the image formation region; and a step of exposing an untransferred region of the resist film using the set of patterns on the reticle under a different exposure condition from that in the step of transferring the set of patterns.

The exposure condition is such that the set of patterns on the reticle is not transferred to the untransferred region.

In the exposure method according to the present invention, the untransferred region of the resist film is exposed using the same set of patterns on the reticle. Therefore, no pattern is necessary for exposing the untransferred region. In other words, this method does not require a dedicated reticle, such as a blank reticle, and also does not require a dedicated set of patterns, such as blank patterns of geometrical shapes, for the exposure of the untransferred region.

As a result, the untransferred region of the resist film can be removed without decreasing exposure system throughput and without increasing semiconductor device fabrication cost.

The resist film is preferably a positive resist. When such is the case, during development process of the resist film, the set of patterns on the reticle is transferred to the image formation region of the resist film, and at the same time, the untransferred region of the resist film is entirely removed.

In a preferred embodiment of the invention, the different exposure condition for the step of exposing the untransferred region is realized by defocusing exposing light on the untransferred region.

This defocusing of the exposing light may be performed by moving the resist film along the optical axis of the light or by changing the transparent area of a reticle blind.

In another preferred embodiment of the invention, the different exposure condition for the step of exposing the untransferred region is realized by increasing the intensity of exposing light on the untransferred region.

If the intensity of the exposing light is increased to a level where an image is formed in the resist film the resist film will be subjected to the light even at the parts corresponding to the opaque parts of the patterns. This is approximately equivalent to when the entire resist film is illuminated by the light using a blank reticle.

Accordingly, the untransferred region of the resist film can be removed by increasing intensity of the light.

In another preferred embodiment of the invention, at least one of the reticle and the resist film is moved in a plane perpendicular to the optical axis of the exposing light while exposing the resist film to the light.

As a result of this movement during the exposure, the untransferred region of the resist film tends to be illuminated by the exposing light with varying intensity. Therefore, this movement also can realize the above exposure condition wherein the patterns on the reticle are not transferred to the untransferred region.

The distance of each movement is preferably longer than the maximum line width of the set of patterns on the reticle, because each part of the resist film corresponding to each opaque part of the reticle is thereby certain to be illuminated by the exposing light.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will now be described in detail below with reference to the attached drawings.

FIRST EMBODIMENT

Figure 2:
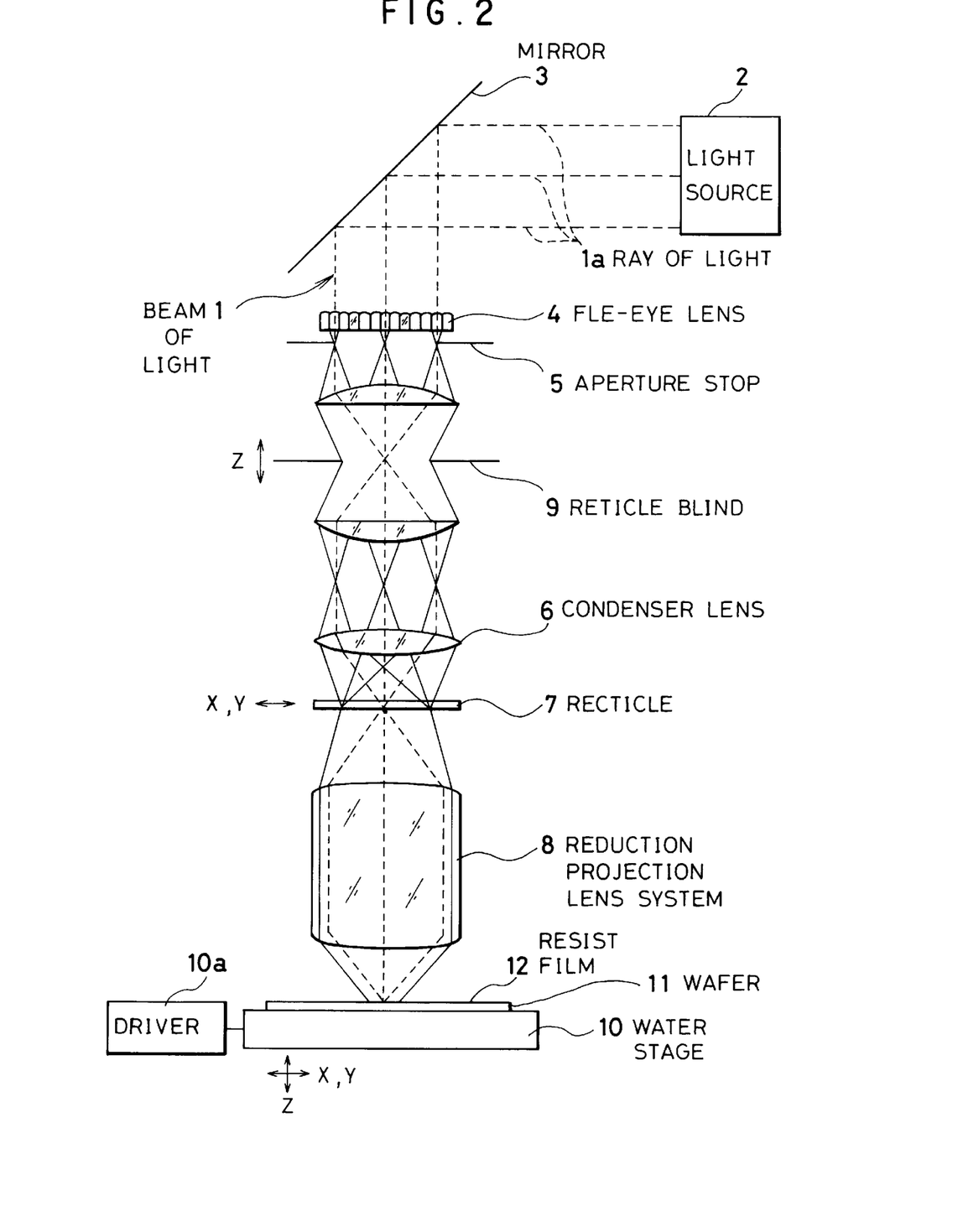
FIG. 2 is a schematic view showing a reduction step-and-repeat projection exposure system.

An exposure method according to a first embodiment of the invention is performed by using a reduction step-and-repeat projection exposure system as shown in FIG. 2. This exposure system is equipped with a light source unit 2, reflection mirror 3, fly-eye lens 4, aperture stop 5, reticle blind 9, condenser lens 6, reduction projection lens system 8 and wafer state 10.

In an exposure process, a reticle 7 having patterns of geometrical shapes is placed between the condenser lens 6 and the reduction projection lens system 8. A semiconductor wafer 11 with a photoresist film 12 thereon is placed on the wafer state 10.

The wafer stage 10 can be translated within a horizontal plane along the X and Y directions, and be vertically moved along the Z direction. This movement is created by a driver unit 10a.

The light source unit 2 generates exposing UV light and emits a beam 1 of the light toward the reflection mirror 3. The beam 1 includes a plurality of optical rays 1a. The mirror 3 reflects the beam 1 and changes its direction toward the fly-eye lens 4.

The fly-eye lens 4 receives the beam 1 and minimizes its illumination variation or fluctuation, thereby making the intensity of the beam 1 uniform within its cross-section at the outlet of the lens 4.

The aperture stop 5 narrows the diameter of the beam 1 of the exposing light penetrating through the fly-eye lens 4. Also, the stop 5 adjusts the intensity distribution within the cross-section of the beam 1.

The reticle blind 9 masks the periphery of the beam 1 of the light so as to adjust the size of the illumination are or chip site on the resist film 12. The reticle blind 9 can be shifted upward and downward along the Z direction parallel to the optical axis of the beam 1.

The condenser lens 6 focuses the beam 1 on the reticle 7.

Figure 3:
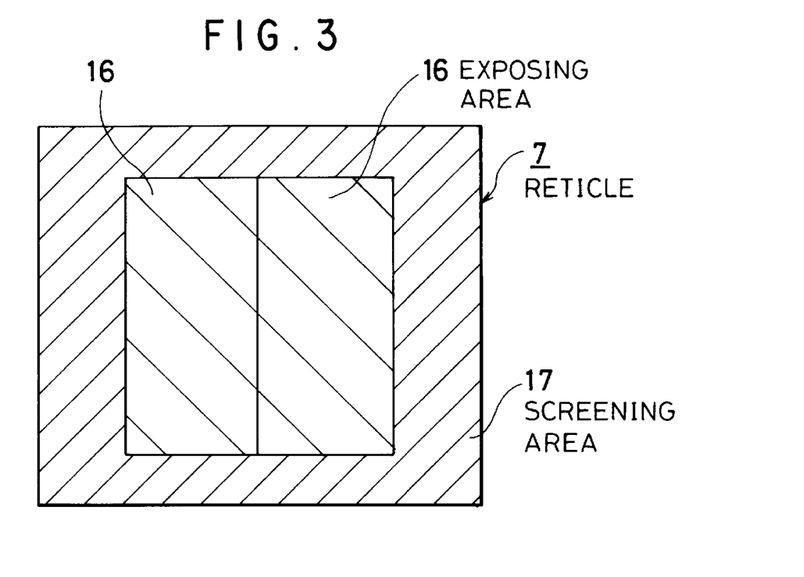
FIG. 3 is a schematic plan view of a reticle used for the exposure system of FIG. 2.

As shown in FIG. 3, the reticle 7 has two rectangular exposing area 16 formed adjacent to each other and a rectangular-ringed screening area 17 formed so as to surround the area 16. Each of the exposing areas 16 has a set of patterns of geometrical shapes to be transferred, The beam 1 of light passes through the exposing areas 16 so as to enter the projection lens system 8. The beam 1 is screened or cut off by the screening area 17.

The reduction projection lens system 8 projects an image of the two sets of patterns on the reticle 7 onto the photoresist film 12 on the semiconductor wafer 11 with a specified demagnification ratio, such as ⅕, during each exposing step. Each set of the patterns defines the various regions in the IC chip, such as the implantation regions and the contact windows.

Figure 4:
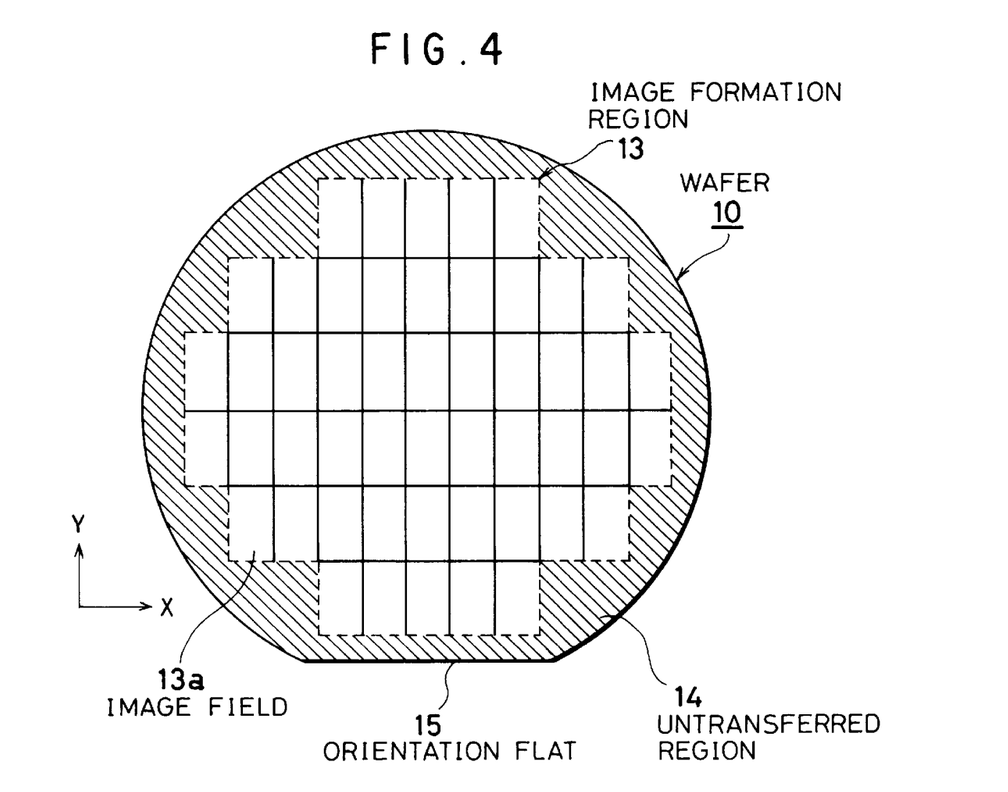
FIG. 4 is a schematic plan view of a semiconductor wafer on which the set of patterns is transferred.

As shown in FIG. 4, the photoresist film 12 on the wafer 10 is partitioned into a plurality of image fields 13 *a* arranged in a matrix array. Since the reticle 7 has the two exposing area 16, the two image fields 13 *a* are exposed to the beam 1 at one time. The shape of each image field 13 *a* is the same as that of the exposing area 16 of the reticle 7. The size of each image field 13*a* is proportional to that of the exposing area 16 according to the demagnification ratio.

The image fields 13 *a* of the resist film 12 on the wafer 6 are stepped over its surface by two-dimensional translations of the wafer 6 in a horizontal plane, which are generated by movement of the wafer state 10 in the X and Y directions.

Thus, all the image fields 13 *a* are successively exposed to the beam 1 of light in a step-and-repeat manner, thereby transferring the patterns on the reticle 7 onto all the image fields 13*a*, respectively.

Next, the exposure method according to the first embodiment is described below referring the FIG. 5, which is performed by using the exposure system of FIG. 2.

First, the reticle 7 is loaded onto the exposure system between the condenser lens 6 and the projection lens system 8 (step S1). Then, the position of the reticle 7 is adjusted so as to be in alignment to the reference position of the system (step S2).

The semiconductor wafer 11 with the positive photoresist film 12 thereon is placed on the wafer stage 10, and the position of the wafer 10 is adjusted so as to be in alignment with the reference position (step S3).

Subsequently, a plurality of optical exposure processed are performed in a step-and-repeat manner for the image fields 13*a* of the photoresist film 12 (step S4). The step-and-repeat movement is produced by the displacement of the wafer state 10 in the horizontal plane.

Thus, the two sets of patterns on the reticle 7 are transferred to the respective image fields 13*a*. In other words the entire image formation region 13 is exposed and pattern transferred.

The above steps S1 to S4 are the same as those in the conventional methods.

Next, unlike the conventional methods, at least one of the wafer stage 10 and reticle 7 is shifted vertically along the Z direction to thereby defocus the beam 1 of the exposing light on the photoresist film 12 (step S5).

Figure 6:
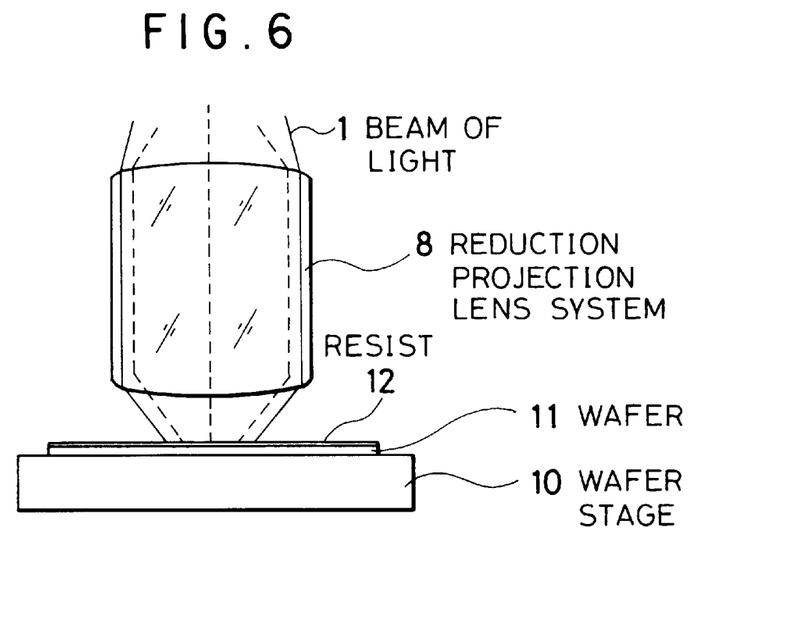
FIG. 6 is a schematic view showing a defocused state of the exposing light in the exposure method according to the first embodiment of the invention.
Figure 7:
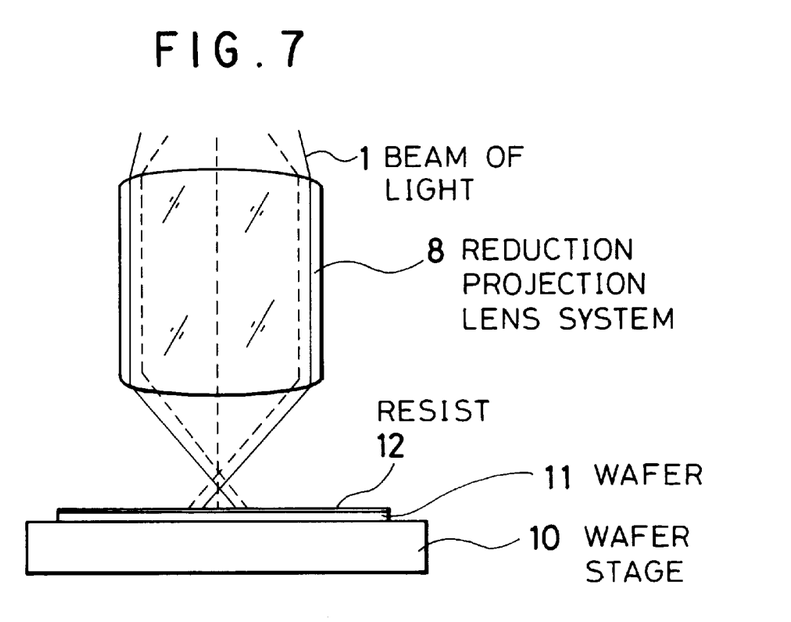
FIG. 7 is a schematic view showing another defocused state of the exposing light in the exposure method according to the first embodiment of the invention.

FIG. 6 shows a defocused state where the focus of the beam 1 is located below the film 12. FIG. 7 shows another defocused state wherein the focus of the beam 1 is located over the film 12.

While keeping the defocused state of the beam 1, a plurality of optical exposure processes are performed in a step-and-repeat manner for the untransferred region 14 of the photoresist film 12 (step S6). Thus, the entire untransferred region 14 is exposed to the beam 1 of light. The step-and-repeat movement is produced by the displacement of the wafer state 10 in the horizontal plane, which is the same as that of the step S4.

In this step S6, the reticle 7 is not replaced with another. In other words, the reticle 7 with the sets of patterns is used for the untransferred region 14, instead of a blank reticle with no pattern thereon. Therefore, the beam 1 of the light irradiated to the region 14 does not have a uniform intensity within the entire cross section perpendicular to its optical axis. However, the patterns on the reticle 7 are scarcely transferred to the region 14, because the beam 1 is defocused so as to be irradiated onto the region 14.

The shifting or defocus distance may be such that substantially no patterns are transferred to the untransferred region 14, and the region 14 can be entirely removed during a subsequent development process.

The shifting or defocus distance is preferably 5 to 10 $\mu$m because the tolernace for the focus state is typically±0.1 $\mu$m.

During this exposure process in S6, it is necessary for the beam 1 of light not to be emitted from the periphery of the exposing areas 16 of the reticle 7. This can be accomplished by vertically shifting the reticle blind 9 along the Z direction and/or changing the size of the transparent area of the blind 9.

Finally, the photoresist film 12 thus exposed is developed by using a popular development solution (step S7). Through this development process, the exposed parts of the photoresist film 12 are removed so that the pattern so the photoresist film 12 are removed so that the patterns on the reticle 7 are transferred to the respective image fields 13*a* in the image formation region 13 of the film 12. At the same time, the untransferred region 14 of the film 12 is entirely removed because it has been entirely exposed to the defocused beam 1 of light.

In the exposure method according to the first embodiment, the untransferred region 14 of the photoresist film 12 is exposed using the same sets of patterns on the reticle 7. Therefore, no dedicated pattern is necessary for exposing the untransferred region 14. In other words, this method requires no dedicated reticle, such as a blank reticle, and also doe not require a dedicated set of patterns, such as blank patterns of geometrical shapes, for the exposure of the untransferred region.

As a result, the untransferred region 14 can be removed without decreasing exposure system throughput and without increasing IC fabrication cost.

SECOND EMBODIMENT

Figure 8:
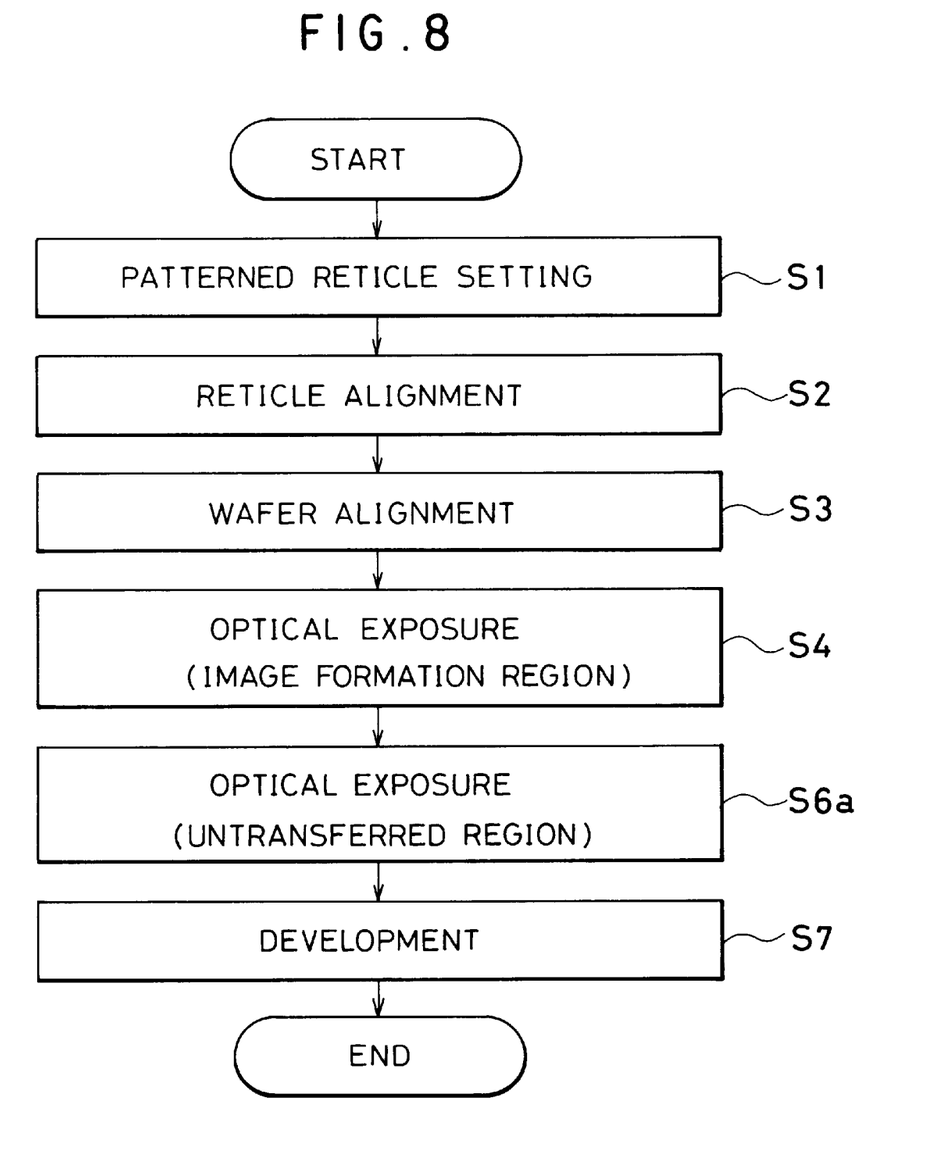
FIG. 8 is a flow chart showing an exposure method of a semiconductor device according to a second embodiment of the invention.

FIG. 8 shows an exposure method according to a second embodiment of the present invention.

Figure 5:
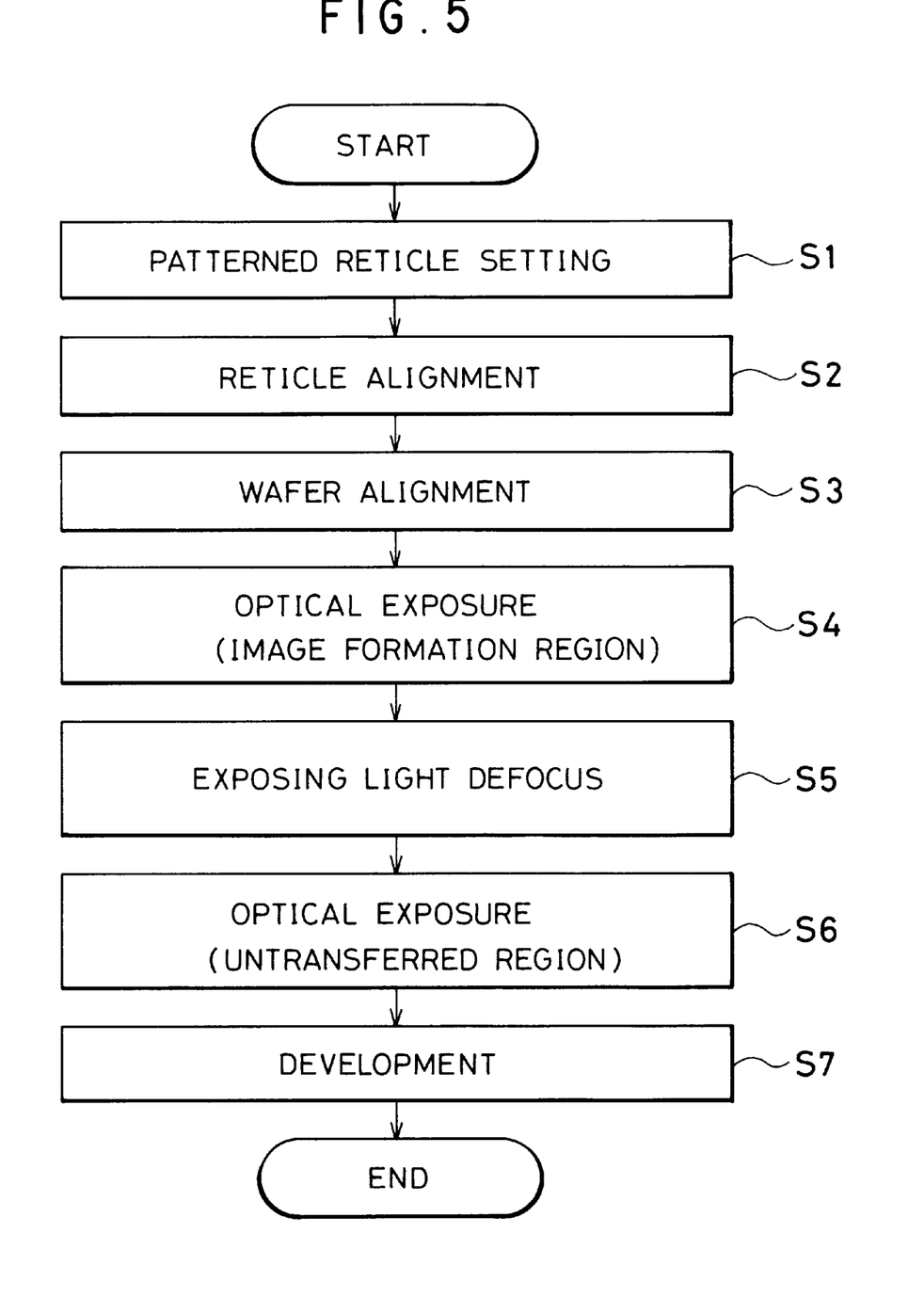
FIG. 5 is a flow chart showing an exposure method according to a first embodiment of the invention.

The steps S1 to S4 and S7 are the same as those in the method of the first embodiment of FIG. 5. Therefore, for the sake of simplification of description, the explanation relating to these steps is omitted here.

The step S5 of exposing-light defocusing in the first embodiment is cancelled.

In step S6*a*, the exposure process for the untransferred region 14 of the photoresist film 12 is performed in the same way as that of the first embodiment except that the intensity of the beam 1 of light is increased. The intensity in the second embodiment is approximately five times as high as that of the first embodiment.

By using the intensity-increased beam 1, the untransferred region 14 can be entirely removed during the development process in of step S7, the reason for which is as follows:

Typically, each exposing area 16 of the reticle 7 contains transparent parts, semi-transparent parts and opaque parts. Almost all of the exposing beam 1 penetrates the transparent parts so as to reach the resist film 12. Approximately half of the beam 1 penetrates the semi-transparent parts so as to reach the resist film 12.

On the other hand, at the opaque parts, almost all of the beam 1 is screened. In other words, a small part of the beam 1 (i.e., leakage light) penetrates so as to reach the resist film 12 at such an extremely low intensity that no image is formed.

If the intensity of the beam 1 is increased to a level where an image is formed in the resist film 12, the film 12 will be subjected to optical exposure not only at the parts corresponding to the transparent and semi-transparent parts but also at the parts corresponding to the opaque parts. This is equivalent to when the entire resist film 12 is illuminated by the beam 1 using the reticle without patterns. In other words, this is equivalent to when the resist film 12 is exposed to the beam 1 using a blank reticle.

Accordingly, the entire untransferred region 14 of the resist film 12 can be removed by increasing intensity of the beam 1.

With the exposure method according to the second embodiment, the intensity increase of the beam 1 provides substantially the same effect as defocusing the beam 1 in the first embodiment and therefore, the same advantage as that of the first embodiment can be obtained.

THIRD EMBODIMENT

Figure 9:
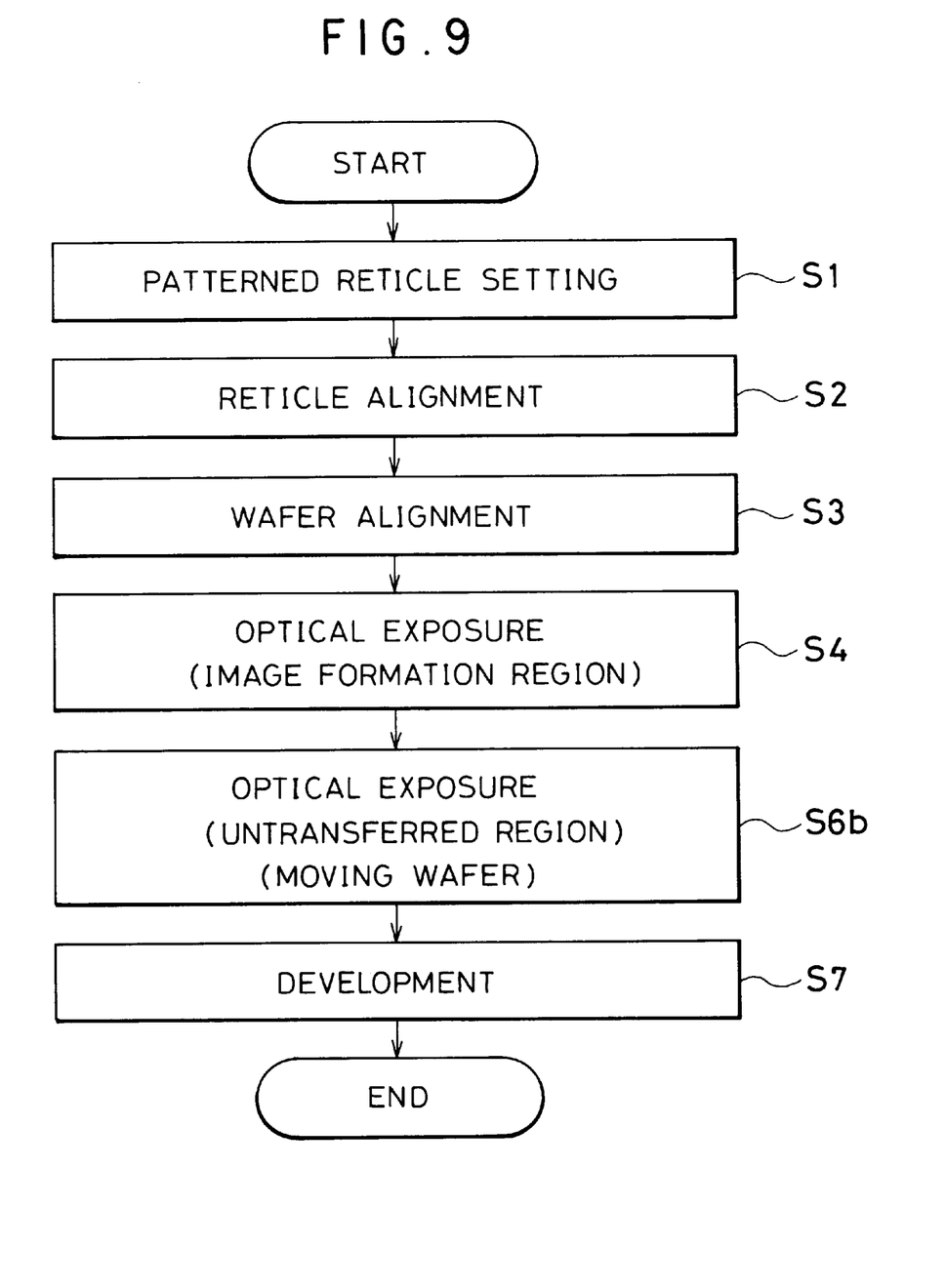
FIG. 9 is a flow chart showing an exposure method according to a third embodiment of the invention.

FIG. 9 shows an exposure method according to a third embodiment of the present invention.

The steps S1 to S4 and S7 are the same as those in the method according to the first embodiment of FIG. 5. Therefore, for the sake of simplification of description, the explanation relating to these steps is omitted here.

Similar to the second embodiment, step S5 of the exposing-light defocusing in the first embodiment is cancelled.

In step S6b, the exposure process for the untransferred region 14 of the photoresist film 12 is performed in the same way as that in the first embodiment, except that the region 14 is exposed in a step-and-repeat manner while moving the wafer 11 in the horizontal plane.

Different from the method according to the second embodiment, the intensity of the beam 1 is not increased. The intensity is kept unchanged in step S6b.

Figure 10:
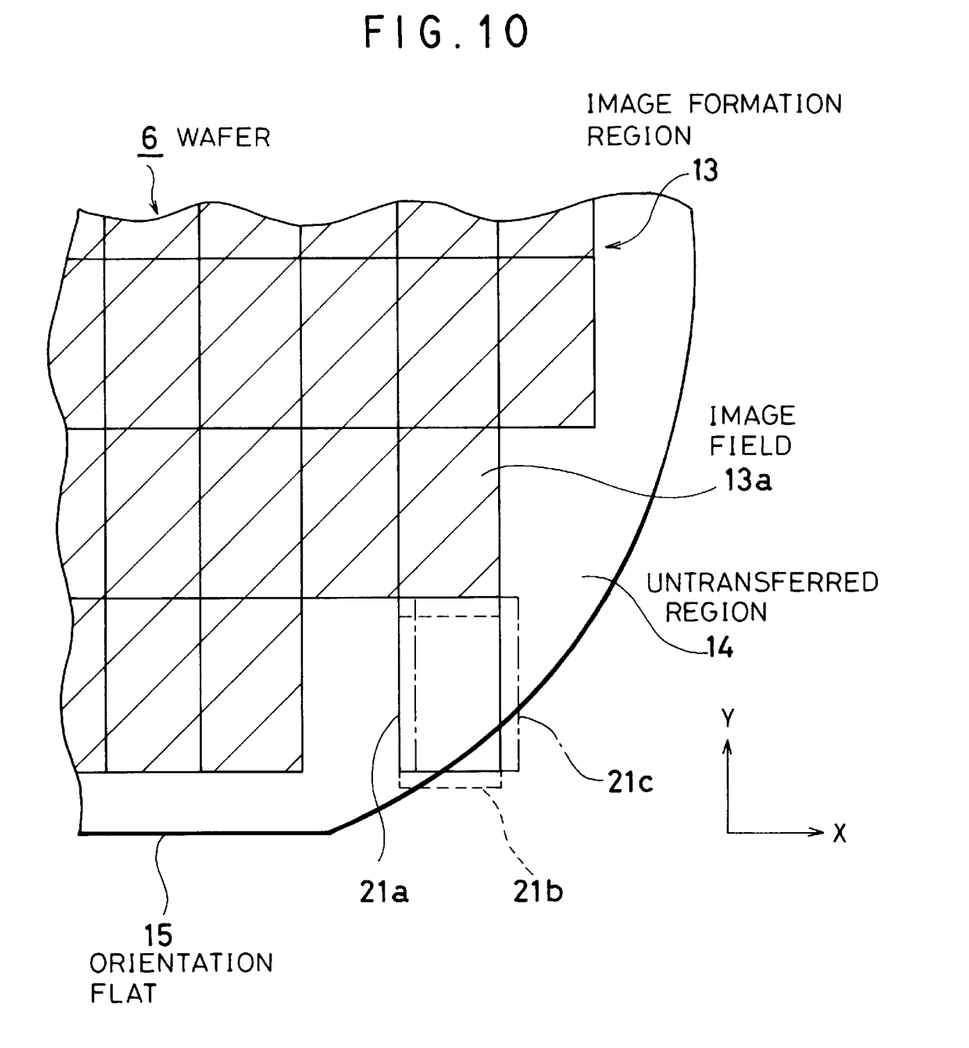
FIG. 10 is a partial plan view of the semiconductor wafer of FIG. 4 showing the relative movement of the exposing light to the wafer.

As shown in FIG. 10, during each exposure step for the untransferred region 14, the wafer 11 is continuously moved or shifted along direction X parallel to the orientation flat 15 and direction Y perpendicular to flat 15.

Specifically, while an area 21a of the untransferred region 14 is exposed to the beam 1, the wafer 11 with the photoresist film 12 is shifted to a position indicated by the reference numeral 21b along the Y direction, and is returned to its original position 21a (first movement). Then, it is shifted again to a position indicated by the reference numeral 21c along the X direction, and is returned to its original position 21a (second movement). The first and second movements are performed in the same exposure step.

The first and second movements may be carried out two or more times in each exposure step, respectively.

The distance of each movement is approximately 2 $\mu$m, which is longer than the maximum line width of the patterns on the reticle 7.

The distance of each movement is preferably longer than the maximum line width of the patterns of the reticle 7, because each part of the resist film 12 corresponding to each opaque part of the patterns on the reticle 7 is thereby certain to be illuminated by beam 1 of light at least one time. This means that the beam 1 is certain to illuminate the entire area 21a of the untransferred region 14 even if the beam 1 does not have a uniform intensity within its cross section.

As a result, in the exposure method according to the third embodiment, the relative movement of the wafer 11 to the beam 1 provides substantially the same effect as that of the beam defocusing in the first embodiment, and therefore, the same advantage as that of the first embodiment can be obtained.

FOURTH EMBODIMENT

Figure 11:
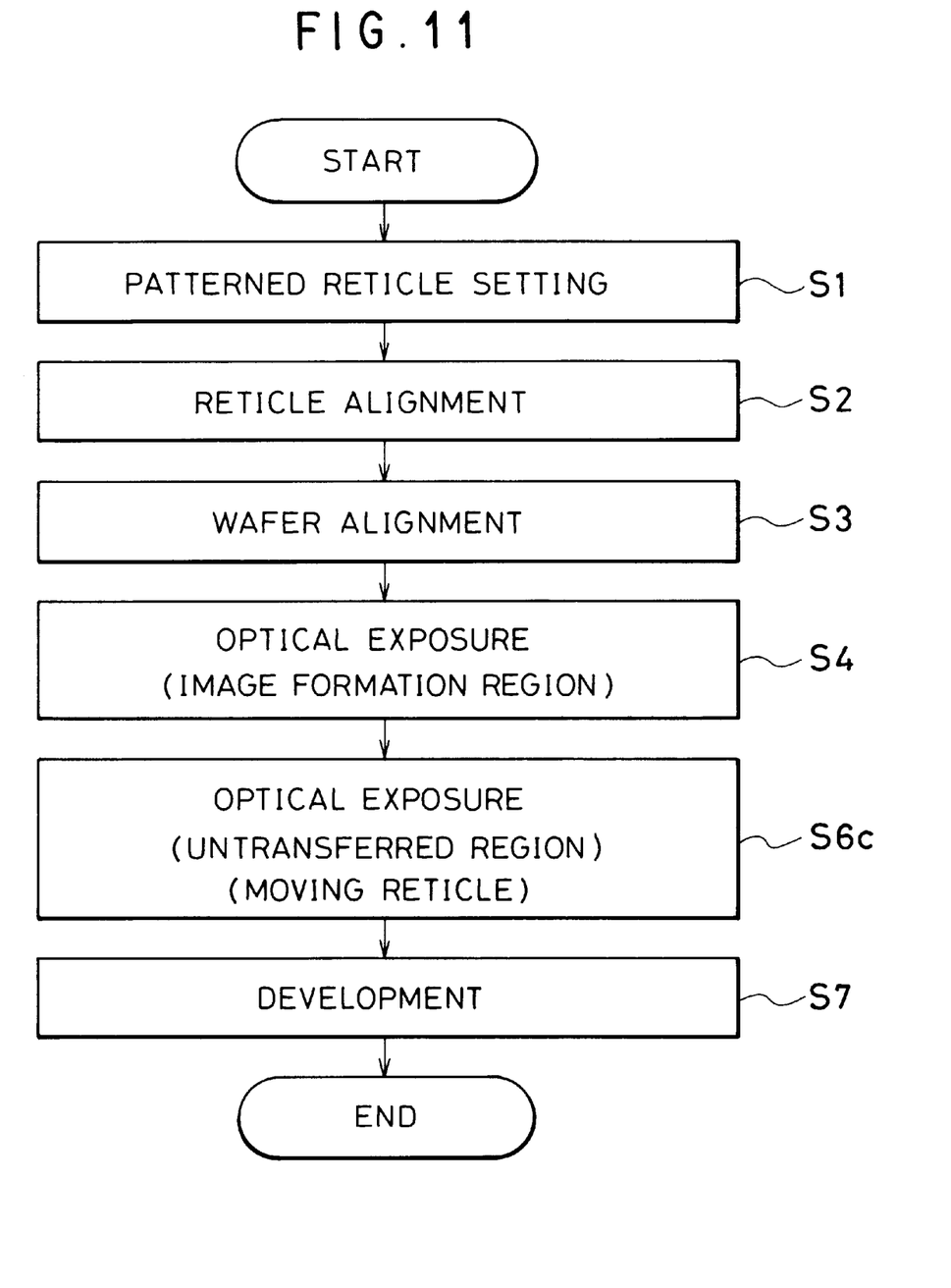
FIG. 11 is a flow chart showing an exposure method according to a fourth embodiment of the invention.

FIG. 11 shows an exposure method according to a fourth embodiment of the present invention.

Steps S1 to S4 and S7 are the same as those in the method of the first embodiment of FIG. 5. Therefore, the explanation relating to these steps is omitted here.

Similar to the second and third embodiments, step S5 of the exposing-light defocusing in the first embodiment is cancelled.

In step S6c, the exposure process for the untransferred region 14 of the photoresist film 12 is performed in the same way as that of the first embodiment except that the region 14 is exposed in a step-and-repeat manner while moving the reticle 7 (rather than the wafer 10) in the horizontal plane.

Different from the method according to the second embodiment, the intensity of the beam 1 is kept unchanged in this step S6c.

During each exposure step for the untransferred region 14, the reticle 7 is continuously moved or shifted along directions X and Y in the same way as that of the third embodiment.

If the demagnification ratio of the exposure system is one fifth (⅕), it is preferred that the movement distance of the reticle 7 be approximately 10 $\mu$m (=2×5). In this case, this movement of the reticle 7 is equivalent to that of the wafer 11.

Thus, with the exposure method according to the fourth embodiment, the movement of the reticle 7 relative to the beam 1 provides substantially the same effect as that of the beam defocusing in the first embodiment, and therefore, the same advantage as that of the first embodiment can be obtained.

While the preferred forms of the present invention have been described, it is to be understood that modifications will be apparent to those skilled in the art without departing from the spirit of the invention. The scope of the invention, therefore is to be determined solely by the following claims.

What is claimed is:

1. An exposure method of a semiconductor device, said method comprising the steps of:

preparing a reticle with a single set of patterns of geometrical shapes;

exposing an image formation region of a resist film using said single set of patterns on said reticle, thereby transferring said set of patterns to said image formation region; and exposing and removing an untransferred region of said resist film under a different exposure condition from that in the step of transferring said single set of patterns;

wherein said different exposure condition is so determined that said set of patterns on said reticle is not transferred to said untransferred region, and wherein said single set of patterns is being used for both said image formation region and said untransferred region.

2. The exposure method as claimed in claim 1, wherein said resist film is a positive resist film.

3. The exposure method as claimed in claim 1, wherein said different exposure condition for the step of exposing said untransferred region is realized by defocusing an exposing light on said untransferred region.

4. The exposure method as claimed in claim 3, wherein said defocusing said exposing light is performed by moving said resist film along the optical axis of said light.

5. The exposure method as claimed in claim 3, wherein said defocusing said exposing light is performed by changing said area of a reticle blind.

6. The exposure method as claimed in claim 1, wherein said different exposure condition for the step of exposing said untransferred region is realized by changing the intensity of said exposing light on said untransferred region.

7. The exposure method as claimed in claim 1, wherein said different exposure condition for the step of exposing said untransferred region is realized by at least one of said reticle and said resist film is moved in a plane perpendicular to the optical axis of said exposing light while exposing said resist film to said light.

8. An exposure method of a semiconductor device, said method comprising the steps of:

preparing a reticle with a single set of patterns of geometrical shapes;

preparing a semiconductor wafer with a resist film thereon;

exposing image fields of an image formation region of said resist film using said single set of patterns on said reticle in a step-and-repeat manner, thereby transferring said single set of patterns to said image fields, respectively; and exposing parts of an untransferred region of said resist film using said single set of patterns on said reticle in a step-and-repeat manner under a different exposure condition from that in the step of transferring said set of patterns on said image formation region, thereby exposing all of said untransferred region;

wherein said exposure condition is so determined that said set of patterns on said reticle is not transferred to said respective parts of said untransferred region; and wherein said single set of patterns is being used for both said image formation region and said untransferred region.

9. The exposure method as claimed in claim 8, wherein said resist film is a positive resist film;

and wherein said untransferred region of said resist film is removed in a subsequent development process.

10. The exposure method as claimed in claim 8, wherein said different exposure condition for the step of exposing said untransferred region is realized by defocusing an exposing light on said untransferred region.

11. The exposure method as claimed in claim 10, wherein said defocusing said exposing light is performed by moving said wafer along the optical axis of said light.

12. The exposure method as claimed in claim 10, wherein said defocusing said exposing light is performed by changing said area of a reticle blind.

13. The exposure method as claimed in claim 8, wherein said different exposure condition for the step of exposing said untransferred region is realized by changing the intensity of an exposing light on said untransferred region.

14. The exposure method as claimed in claim 8, wherein said different exposure condition for the step of exposing said untransferred region is realized by moving at least one of said reticle and said wafer in a plane perpendicular to the optical axis of said exposing light while exposing said resist film to said light.

* * * * *